United States Patent
Alexander et al.

(10) Patent No.: US 7,709,919 B2
(45) Date of Patent: May 4, 2010

(54) SOLID-STATE IMAGE SENSING DEVICE INCLUDING ANTI-REFLECTION STRUCTURE INCLUDING POLYSILICON AND METHOD OF MANUFACTURING THE SAME

(75) Inventors: Getman Alexander, Yongin-si (KR); Bum-suk Kim, Seoul (KR); Yun-ho Jang, Seoul (KR); Sae-young Kim, Suwon-si (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 131 days.

(21) Appl. No.: 11/679,614

(22) Filed: Feb. 27, 2007

(65) Prior Publication Data
US 2007/0201137 A1 Aug. 30, 2007

(30) Foreign Application Priority Data
Feb. 28, 2006 (KR) .................. 10-2006-0019585

(51) Int. Cl.
*H01L 31/0216* (2006.01)
(52) U.S. Cl. .............. 257/437; 257/432; 257/436; 257/462; 257/E31.119; 257/E31.127; 348/294
(58) Field of Classification Search ............. 257/462, 257/E31.002, 431, 432, 436, 437, 461, E31.119, 257/E31.127; 348/294
See application file for complete search history.

(56) References Cited

U.S. PATENT DOCUMENTS

| | | | | |
|---|---|---|---|---|
| 6,885,047 B2* | 4/2005 | Shinohara et al. | ............ | 257/292 |
| 7,276,429 B2* | 10/2007 | Yamanaka | ............ | 438/455 |
| 2002/0060742 A1* | 5/2002 | Takubo | ............ | 348/241 |
| 2003/0179324 A1* | 9/2003 | Yamazaki | ............ | 349/43 |

FOREIGN PATENT DOCUMENTS

| | | |
|---|---|---|
| JP | 2003-209235 | 7/2003 |
| JP | 2004-247552 | 9/2004 |
| JP | 2005-142510 | 6/2005 |
| KR | 1999-0084602 | 12/1999 |

\* cited by examiner

*Primary Examiner*—Davienne Monbleau
*Assistant Examiner*—Eduardo A Rodela
(74) *Attorney, Agent, or Firm*—F. Chau & Associates, LLC

(57) ABSTRACT

A solid-state image sensing device including an anti-reflection structure that uses polysilicon and a method of manufacturing the same, in which the solid-state image sensing device includes a photodiode region and a transistor region. The photodiode region includes a semiconductor substrate, a first anti-refection layer, a second anti-reflection layer, and a top layer. The first anti-reflection layer is formed on the semiconductor substrate, and the second anti-reflection layer is formed on the first anti-reflection layer. The top layer is formed on the second anti-reflection layer. Each of the semiconductor substrate and the second anti-reflection layer is formed of a first material, and each of the first anti-reflection layer and the top layer is formed of a second material different from the first material.

6 Claims, 7 Drawing Sheets

SOLID-STATE IMAGE SENSING DEVICE INCLUDING ANTI-REFLECTION STRUCTURE INCLUDING POLYSILICON AND METHOD OF MANUFACTURING THE SAME

CROSS-REFERENCE TO RELATED PATENT APPLICATION

This application claims the benefit of Korean Patent Application No. 10-2006-0019585, filed on Feb. 28, 2006, in the Korean Intellectual Property Office, the disclosure of which is incorporated herein in its entirety by reference.

BACKGROUND OF THE INVENTION

1. Technical Field

The present disclosure relates to a solid-state image sensing device and more particularly, to a solid-state image sensing device including an anti-reflection structure (ARS) that includes polysilicon and a method of manufacturing the same.

2. Discussion of Related Art

Complementary metal oxide semiconductor (CMOS) image sensors (CISes) can be manufactured using a conventional semiconductor process and, thus, are widely used. Since CISes are widely used, efforts have been made to improve the performance of such CISes.

Fresnel reflection originating from the characteristics of the materials used for manufacturing a CIS is a crucial factor that reduces the sensing performance of the CIS. An anti-reflection structure (ARS) is used in an effort to prevent performance degradation caused by the Fresnel reflection. However, only some readily available materials are used for the ARS structure. Therefore, it is required to realize an efficient ARS using materials that have a more limited availability, that is, materials that are more specialized.

SUMMARY OF THE INVENTION

Exemplary embodiments of the present invention provide a solid-state image sensing device including an anti-reflection structure (ARS) comprising polysilicon.

Exemplary embodiments of the present invention also provide a method of manufacturing a solid-state image sensing device including an ARS comprising polysilicon.

According to an exemplary embodiment of the present invention, there is provided a solid-state image sensing device having a photodiode region and a transistor region, wherein the photodiode region comprises: a semiconductor substrate; a first anti-reflection layer formed on the semiconductor substrate; a second anti-reflection layer formed on the first anti-reflection layer; and a top layer formed on the second anti-reflection layer, wherein each of the semiconductor substrate and the second anti-reflection layer is formed of a first material, and each of the first anti-reflection layer and the top layer is formed of a different second material.

According to an exemplary embodiment of the present invention, there is provided a solid-state image sensing device having a photodiode region and a transistor region, wherein the photodiode region comprises: a semiconductor substrate formed of a first material; a top layer formed in an upper portion of the photodiode region and formed of a different second material; and a plurality of anti-reflection layers formed between the semiconductor substrate and the top layer, wherein each of the anti-reflection layers is formed of one of the first material and the second material, and the anti-reflection layers formed of the first material and the anti-reflection layers formed of the second material are alternately formed.

In an exemplary embodiment of the present invention, there is provided a solid-state image sensing device having a photodiode region and a transistor region, wherein the photodiode region comprises: a semiconductor substrate formed of a first material; a top layer formed in an upper portion of the photodiode region and formed of a different second material; and a plurality of anti-reflection layers formed between the semiconductor substrate and the top layer, wherein the anti-reflection layers include a second anti-reflection structure layer formed of the second material and a first anti-reflection structure layer formed of the first material.

The first material may comprise polysilicon, and the second material may comprise silicon oxide.

According to an exemplary embodiment of the present invention, there is provided a method of manufacturing a solid-state image sensing device having a photodiode region and a transistor region, the method comprising: forming an insulation layer formed of a second material on a semiconductor substrate formed of a first material; forming a gate on the portion of the insulation layer in the transistor region; forming a first anti-reflection layer formed of the second material on the semiconductor substrate according to the profile of the gate; forming a second anti-reflection layer formed of the first material on the first anti-reflection layer; forming a top layer formed of the second material on the second anti-reflection layer; and etching the first anti-reflection layer, the second anti-reflection layer, and the top layer formed on the transistor region to selectively remove the first anti-reflection layer, the second anti-reflection layer, and the top layer on the gate, and to create a transistor spacer including the first anti-reflection layer, the second anti-reflection layer, and the top layer on the lateral sides of the gate.

In the method, the etching may be performed using a mask process. The first material may comprise polysilicon, and the second material may comprise silicon oxide.

In an exemplary embodiment of the present invention, there is provided a method of manufacturing a solid-state image sensing device having a photodiode region and a transistor region, the method comprising: forming an insulation layer formed of a second material on a semiconductor substrate formed of a first material; forming a gate on the portion of the insulation layer in the transistor region; forming a first anti-reflection layer formed of the second material on the semiconductor substrate according to the profile of the gate; forming a spacer precursor layer formed of a third material on the first anti-reflection layer; selectively removing the spacer precursor layer excluding a portion of the spacer precursor layer that is located on the lateral sides of the gate to create a transistor spacer; forming a second anti-reflection layer formed of the first material on the semiconductor substrate according to the profile of the gate and the transistor spacer; forming a top layer formed of the second material on the second anti-reflection layer; and removing the portions of the first anti-reflection layer, the second anti-reflection layer, and the top layer formed on the transistor region.

In the exemplary method, the removing may comprise forming a photoresist on the photodiode region. The first material may comprise polysilicon, the second material may comprise silicon oxide, and the third material may comprise silicon nitride.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1A:
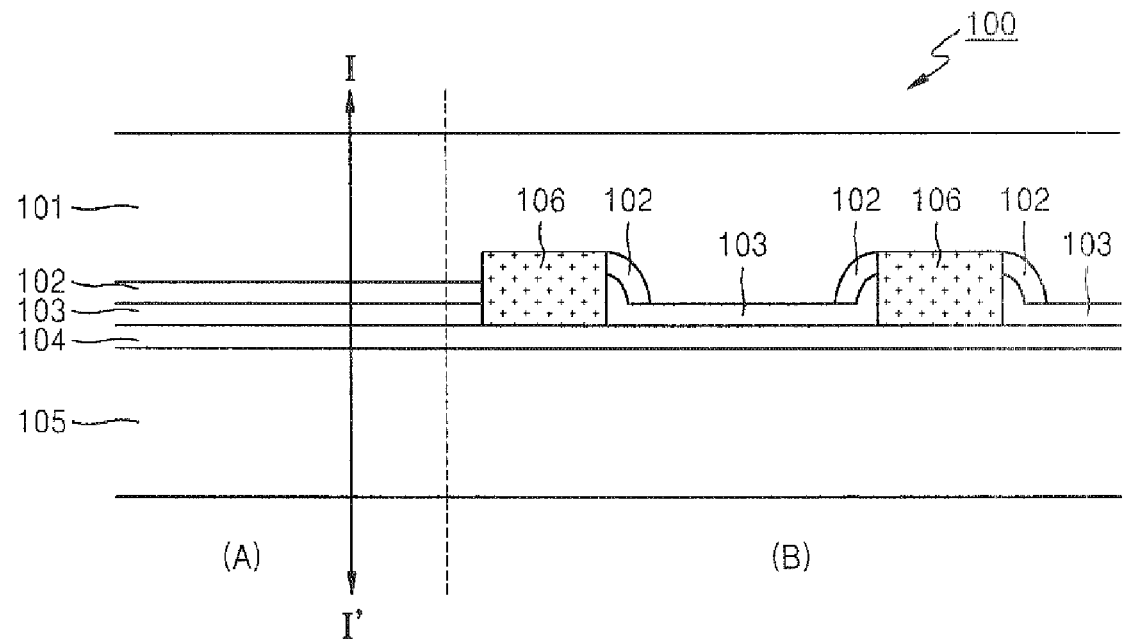
FIG. 1A is a sectional view of a known, generic solid-state image sensing device.

The present invention will now be described more fully with reference to the accompanying drawings, in which exemplary embodiments of the present invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Like reference numerals in the drawings denote like elements and, thus, their descriptions will not be repeated.

FIG. 1A is a sectional view of a known, generic solid-state image sensing device 100. Referring to FIG. 1A, a region A is a photodiode region, and a region B is a transistor region. In the solid-state image sensing device 100, the photodiode region A converts incident light into an electrical signal, and the transistor region B transmits the electrical signal obtained by conversion of the incident light to an image processor (not shown).

Referring to FIG. 1A, the solid-state image sensing device 100 includes a semiconductor substrate 105, two first anti-reflection layers 104 and 103, a second anti-reflection layer 102, and a top layer 101. The semiconductor substrate 105 is formed of silicon, each of the two first anti-reflection layers 104 and 103 is formed of an oxide, the second anti-reflection layer 102 is formed of a nitride, for example, silicon nitride (SiN), and the top layer 101 is formed of an oxide.

Figure 1B:
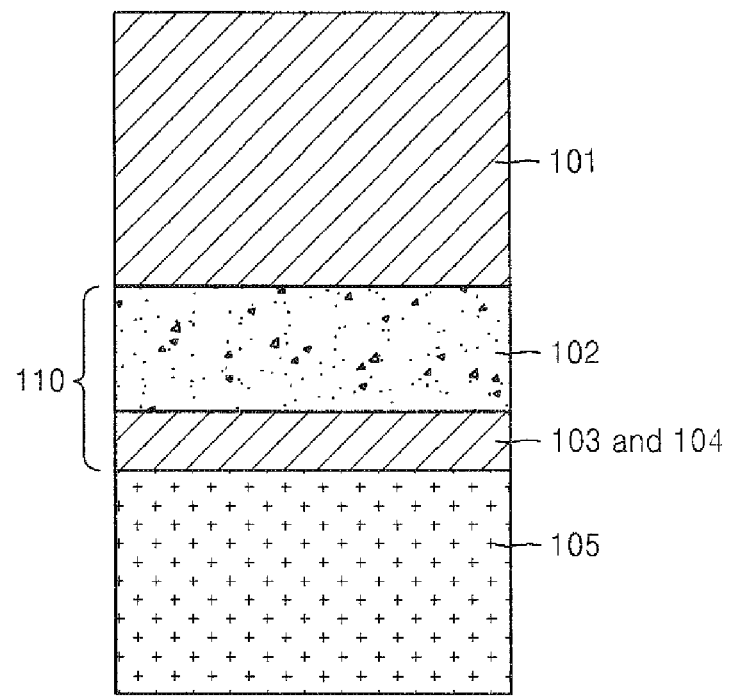
FIG. 1B is a sectional view of a photodiode region of the device taken along a line I-I' of FIG. 1A.

FIG. 1B is a sectional view of the photodiode region A, taken along a line I-I' of FIG. 1A. Referring to FIG. 1B, the two first anti-reflection layers 104 and 103, and the second anti-reflection layer 102 constitute an anti-reflection structure (ARS). The ARS uses interference between light rays reflected at different boundaries. That is, it is possible to reduce the amount of a light ray reflected from the photodiode region A by controlling the thicknesses of respective layers including the first and second anti-reflection layers 104, 103 and 102 that constitute the photodiode region A and forming the respective layers using materials having appropriate refractive indexes.

Figure 2:
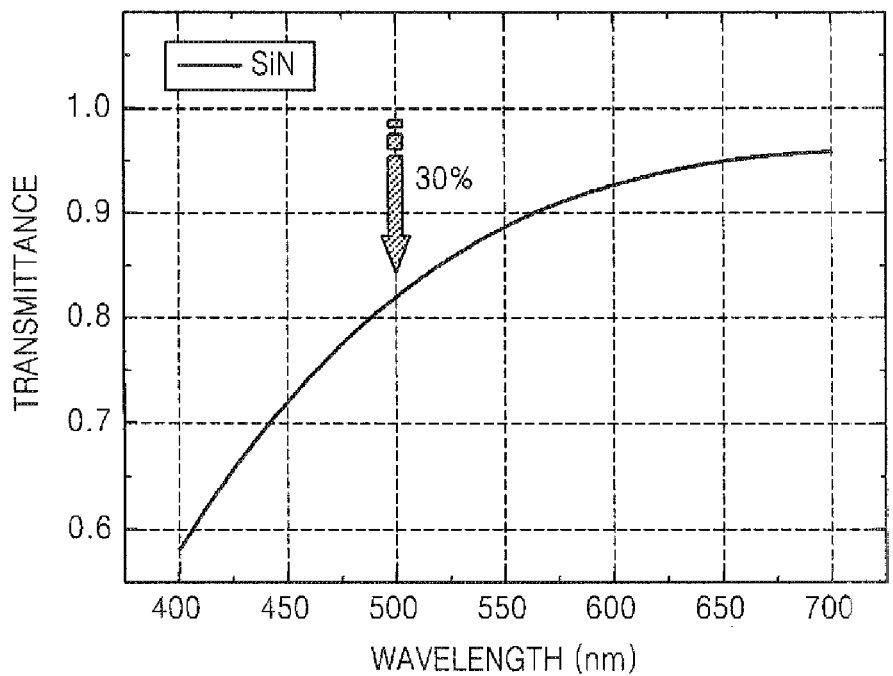
FIG. 2 is a graph illustrating transmittance reduction of the solid-state image sensing device of FIG. 1 in a blue wavelength region.

FIG. 2 is a graph illustrating transmittance reduction of the solid-state image sensing device 100 in a blue wavelength region. Referring to FIG. 2, silicon nitride shows a drastic decrease in the transmittance for a blue wavelength region of 400-450 nm. Therefore, the thickness of the second anti-reflection layer 102 which is formed of silicon nitride needs to be controlled in order to improve the anti-reflection efficiency.

As illustrated in FIG. 1A, however, since silicon nitride is used not only for the second anti-reflection layer 102 but also for an important element of a transistor in the solid-state image sensing device 100, the thickness of a silicon nitride layer serving as the second anti-reflection layer 102 should be maintained at least at a predetermined thickness, for example, 600 Å. Therefore, it is not possible to control the thickness of the silicon nitride layer 102 in an effort to enhance the anti-reflection efficiency of the solid state image sensing device 100.

Figure 3A:
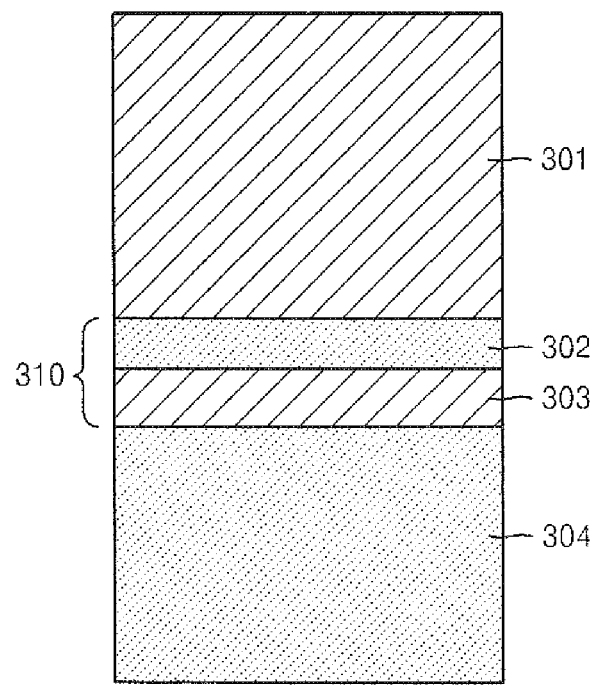
FIG. 3A is a sectional view of a solid-state image sensing device according to an exemplary embodiment of the present invention.

FIG. 3A is a sectional view of a photodiode region of a solid-state image sensing device according to an exemplary embodiment of the present invention. Referring to FIG. 3A, the photodiode region of the solid-state image sensing device is formed of two materials. That is, each of a first anti-reflection layer 303 and a top layer 301 is formed of an oxide, for example, a silicon oxide. Each of a second anti-reflection layer 302 and a substrate 304 is formed of silicon. The operation of the second anti-reflection layer 302 formed of silicon will be described below with reference to FIGS. 4A and 4B.

Figure 4A:
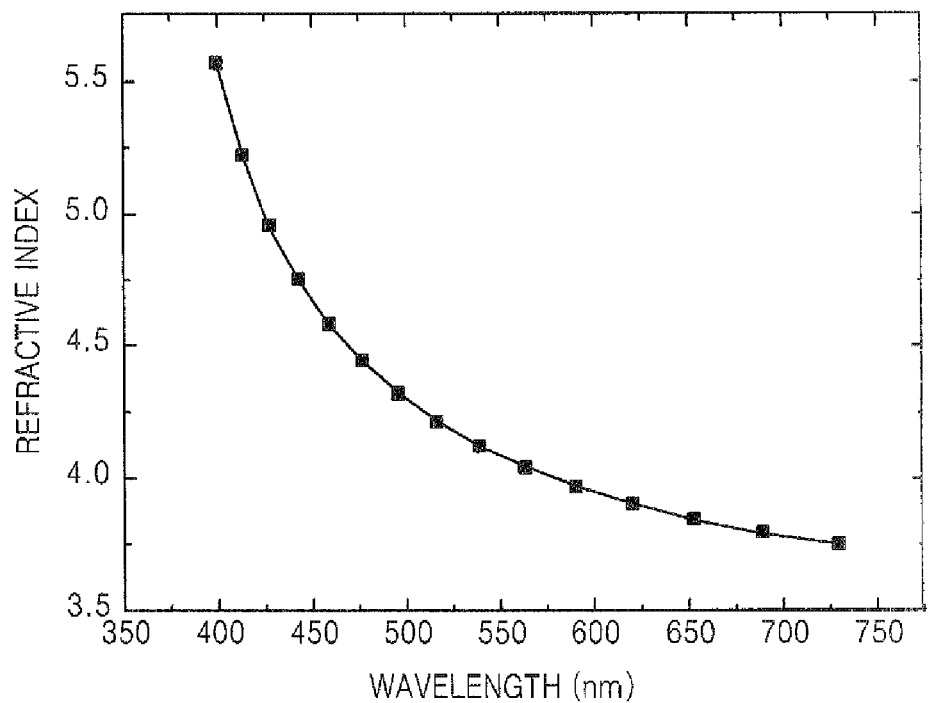
FIGS. 4A and 4B are graphs illustrating optical characteristics of silicon.
Figure 4B:
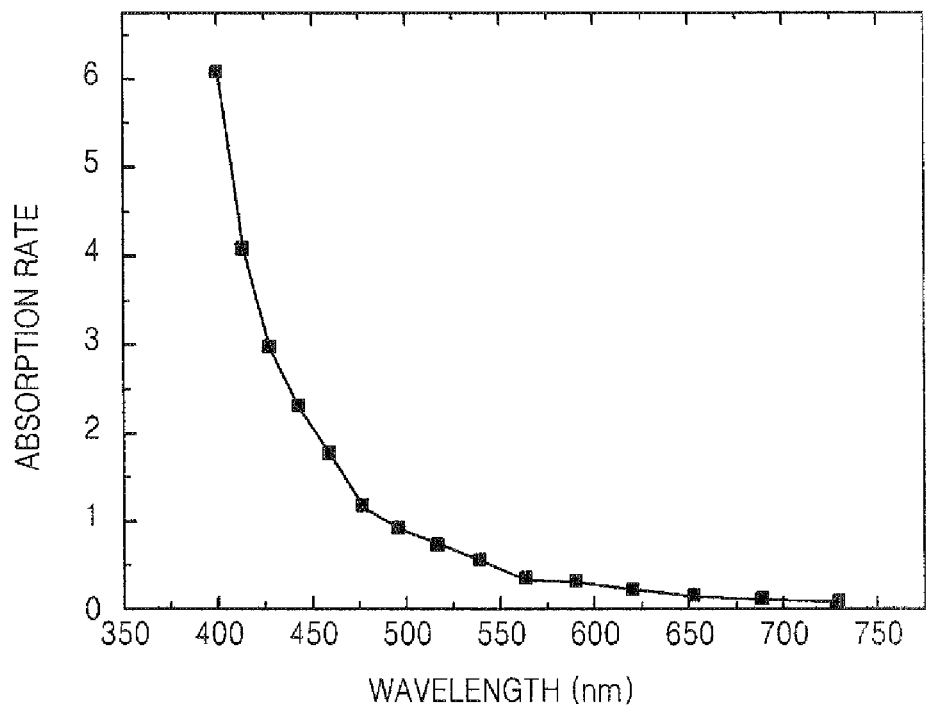

FIGS. 4A and 4B are graphs illustrating optical characteristics of silicon. More specifically, FIG. 4A illustrates the refractive index, that is, dispersion characteristics, of silicon according to wavelength, and FIG. 4B illustrates light absorption of silicon according to wavelength. Referring to FIGS. 4A and 4B, the refractive index, that is, dispersion and light absorption of silicon both drastically increase in a blue wavelength region. Accordingly, it is important to match anti-reflection layers constituting the anti-reflection structure, specifically, to match the dispersions of the anti-reflection layers, in order to realize an anti-reflection structure having uniform performance over the entire visible spectrum.

According to an exemplary embodiment of the present invention, materials used for the anti-reflection layers are the same as those used for the substrate 304 and the top layer 301, respectively. That is, the material used for the first anti-reflection layer 303 is the same as that used for the top layer 301. In other words, an oxide, for example, a silicon oxide, is used for the first anti-reflection layer 303. Also, the material used for the second anti-reflection layer 302 is the same as that used for the substrate 304. For example, silicon is used for the second anti-reflection layer 302.

According to an exemplary embodiment of the present invention, since the materials used for the anti-reflection layers are the same as those used for the substrate 304 and the top layer 301, respectively, the refractive indexes and dispersions of the anti-reflection layers are automatically matched in the photodiode region including the anti-reflection layers.

Figure 3B:
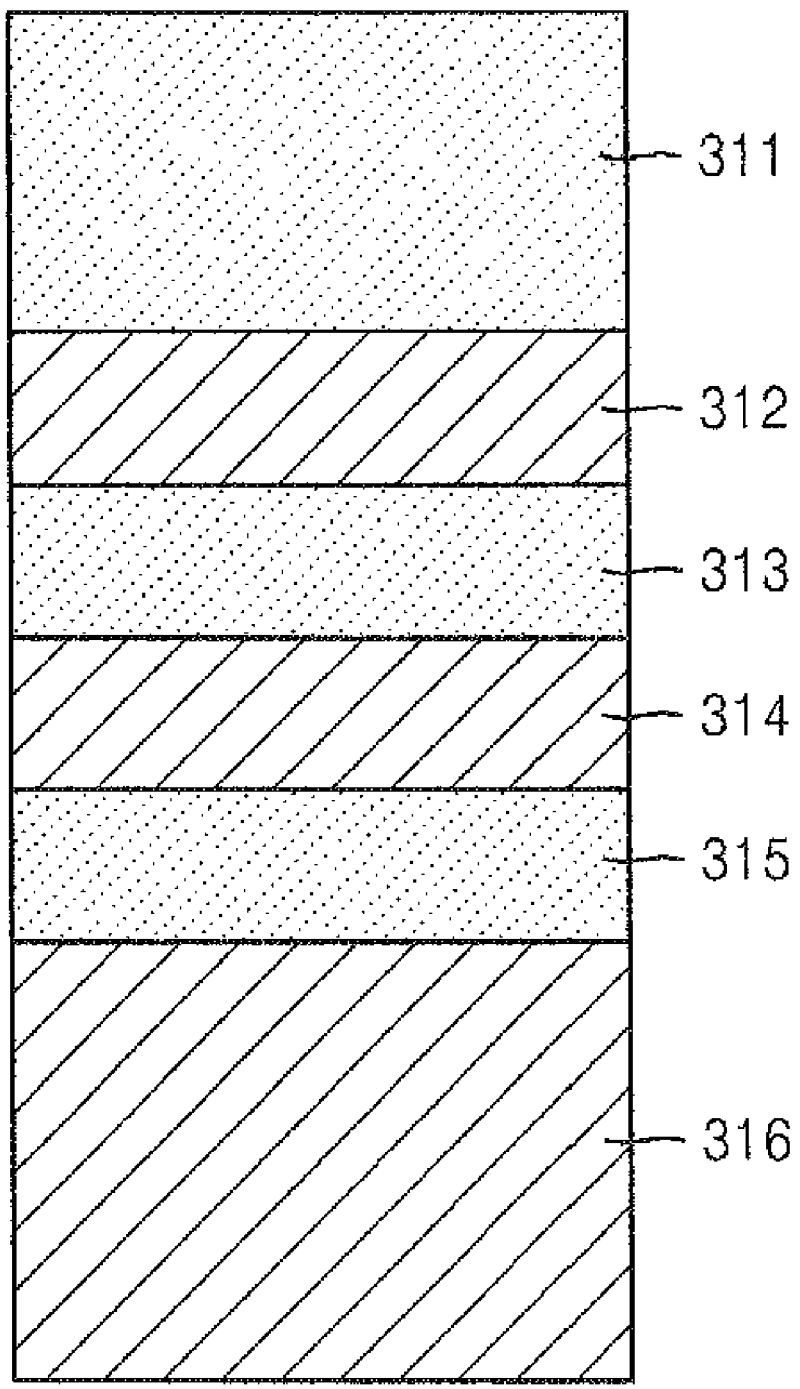
FIG. 3B is a sectional view of a solid-state image sensing device according to an exemplary embodiment of the present invention.

FIG. 3B is a sectional view of a solid-state image sensing device according to an exemplary embodiment of the present invention. As described above, when the materials constituting a substrate and a top layer are respectively the same as the materials constituting the anti-reflection layers, the refractive indexes and dispersions of the anti-reflection layers are automatically matched. Therefore, even when a plurality of anti-reflection layers 312 through 315 are formed of the same materials as a substrate 316 and a top layer 311, respectively, as illustrated in FIG. 3B, the same functions as those of the anti-reflection layers of FIG. 3A will be performed.

The plurality of anti-reflection layers 312 through 315, the substrate 316, and the top layer 311 should be alternately arranged according to the different materials forming the layers. A method of manufacturing a solid-state image sensing device according to an exemplary embodiment of the present invention will be described below with reference to FIGS. 5A through 5B, and FIGS. 6A through 6C.

Figure 5A:
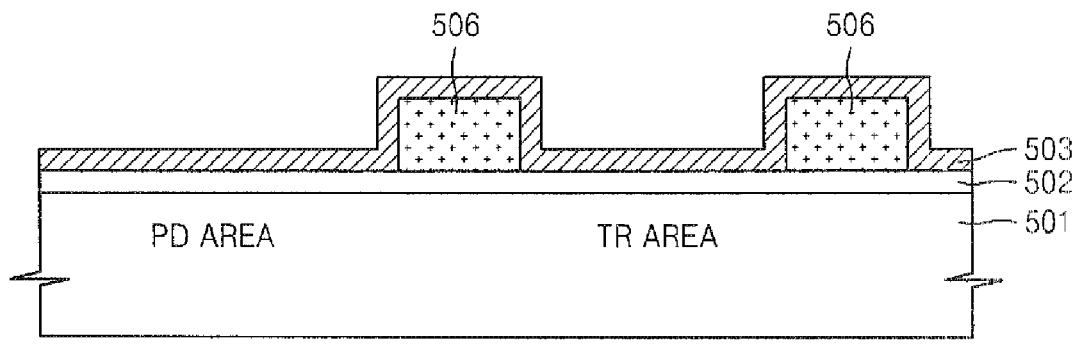
FIGS. 5A through 5C are sectional views illustrating a process of manufacturing a solid-state image sensing device according to an exemplary embodiment of the present invention.
Figure 5B:
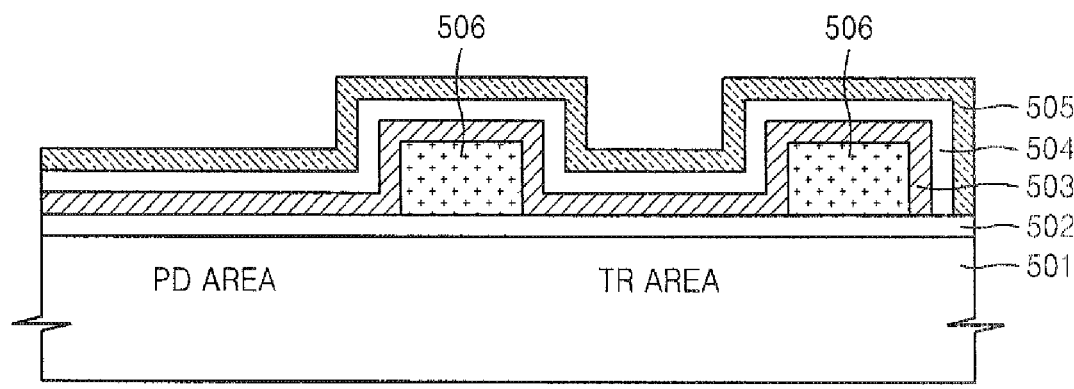
Figure 5C:
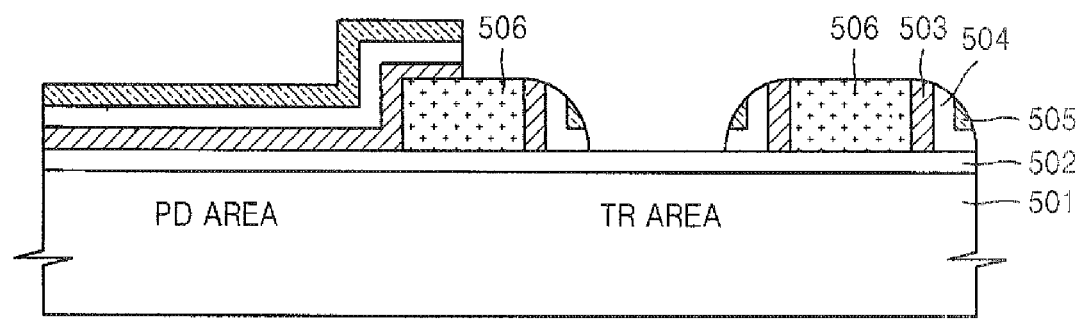

FIGS. 5A through 5C are sectional views illustrating a method of manufacturing a solid-state image sensing device according to an exemplary embodiment of the present invention. Referring to FIG. 5A, an insulation layer 502 formed of a silicon oxide is formed on a silicon substrate 501, and a gate 506 of a transistor is formed in a transistor (TR) area on the insulation layer 502 (FIG. 5A).

The insulation layer 502 insulates the gate 506 from the silicon substrate 501, and simultaneously constitutes a first anti-reflection layer in cooperation with a silicon oxide layer 504, which will be subsequently formed.

After the gate 506 if formed, a silicon oxide layer 503 that will be used for a first anti-reflection layer is formed. The silicon oxide layer 503 constitutes the first anti-reflection layer in cooperation with the silicon oxide layer 502 used as the insulation layer.

Referring to FIG. 5B, after the silicon oxide layer 503 is formed, a polysilicon layer 504 used as a second anti-reflection layer is formed and, subsequently, a top layer 505 made of silicon is formed.

Referring to FIG. 5C, after the top layer 505 is formed, a region excluding a photodiode (PD) area, that is, the top layer 505, the second anti-reflection layer 504, and the first anti-reflection layer 503 in the TR region, is partially removed and, simultaneously, a transistor spacer is formed. According to an exemplary embodiment of the present invention, the partial removing of the top layer 505, the second anti-reflection layer 504, and the first anti-reflection layer 503 may be performed through an etching process using a mask.

Figure 6A:
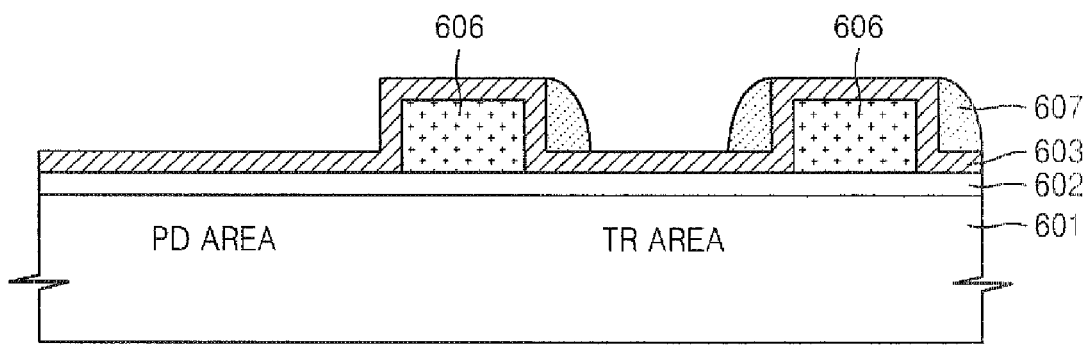
FIGS. 6A through 6C are sectional views illustrating a process of manufacturing a solid-state image sensing device according to an exemplary embodiment of the present invention.
Figure 6B:
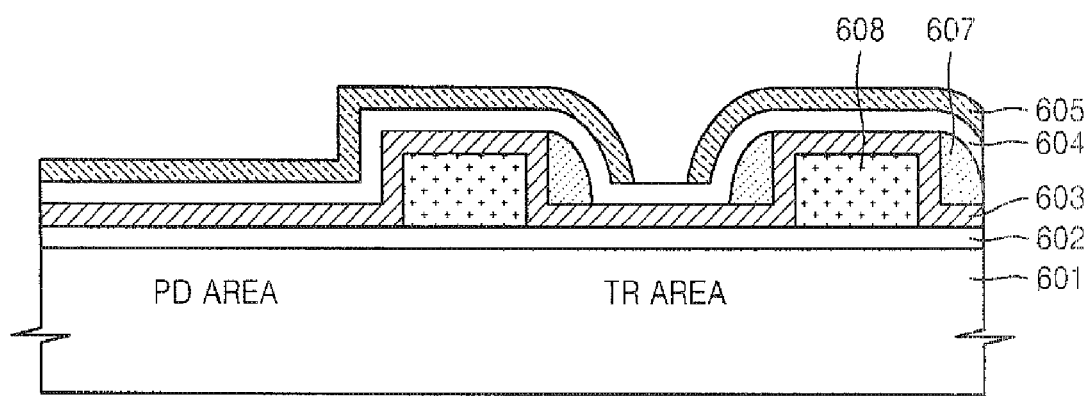
Figure 6C:
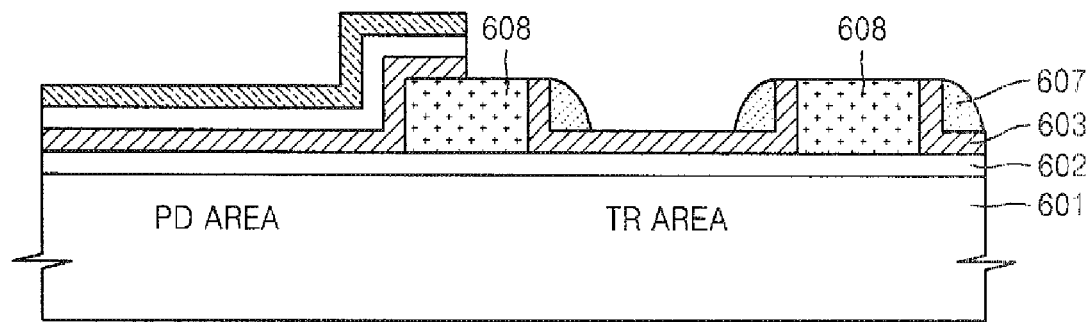

FIGS. 6A through 6C are sectional views illustrating a method of manufacturing a solid-state image sensing device according to an exemplary embodiment of the present invention.

First, a first anti-reflection layer consisting of an insulation layer 602 and a first anti-reflection layer 603 is formed in the same manner as described with reference to FIG. 5A.

Next, a transistor spacer 607 is formed. That is, a spacer precursor layer 607 formed of silicon nitride is formed on the first anti-reflection layer 603. Next, the spacer precursor 607 layer is selectively removed, leaving a portion of the spacer precursor layer 607 that is located at the lateral sides of the gate 606, thereby forming the transistor spacer 607.

Referring to FIG. 6B, after the transistor spacer 607 is formed, a polysilicon layer used as a second anti-reflection layer is formed, and subsequently, a top layer 605 formed of silicon is formed.

Referring to FIG. 6C, after the top layer 605 is formed, a region excluding a PD area, that is, the top layer 605 and the second anti-reflection layer 604 in the TR area, is removed. The exemplary embodiment uses a process of removing the top layer 605 and the second anti-reflection layer 604 on the TR area after forming a photoresist on the PD area.

Figure 7:
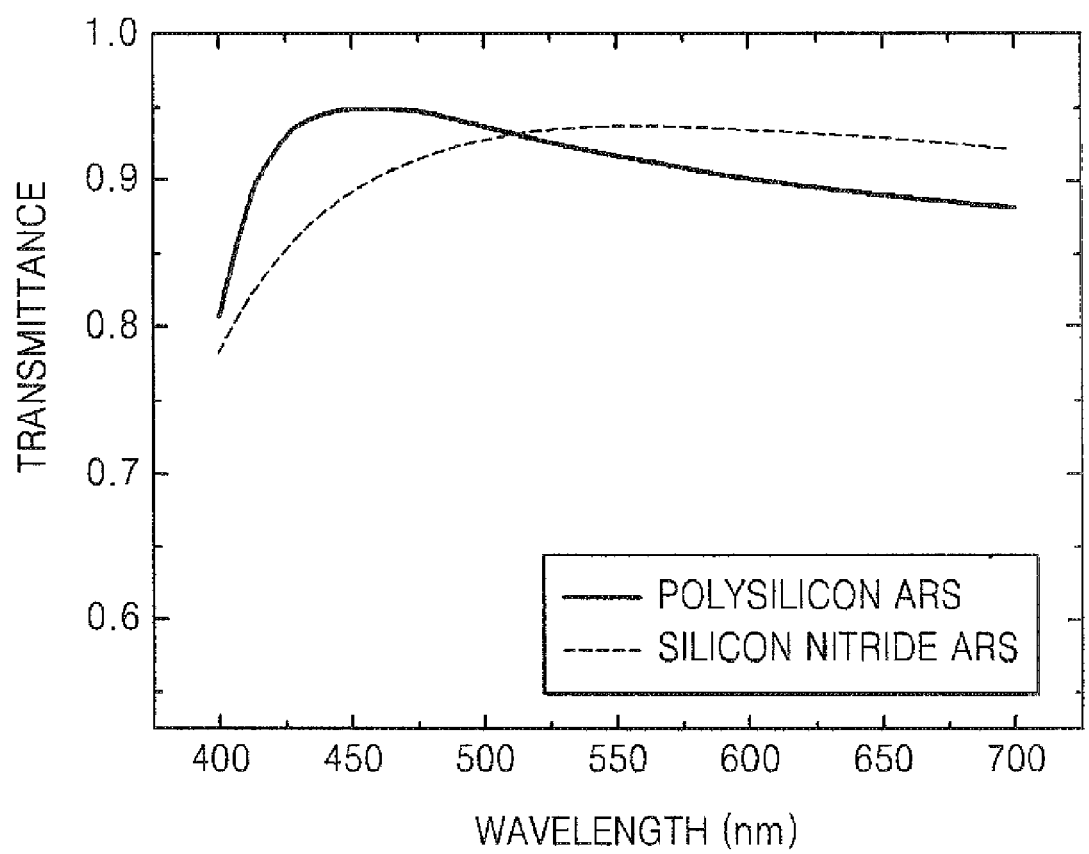
FIG. 7 is a graph comparing the transmittance of a solid-state image sensing device according to an exemplary embodiment of the present invention and that of a known solid state image sensing device.

FIG. 7 is a graph illustrating the transmittance of an ARS of a solid-state image sensing device according to an exemplary embodiment of the present invention and the transmittance of an ARS of a general or conventional solid-state image sensing device. Referring to FIG. 7, the transmittance of an ARS using silicon nitride decreases drastically in a blue wavelength region. The ARS using the polysilicon according to an exemplary embodiment of the present invention, however, has constant transmittance in the visible spectrum.

As described above, the solid-state image sensing device according to an exemplary embodiment of the present invention may reduce Fresnel reflection from the upper portion of the PD area and has constant transmittance over the entire visible spectrum, including the blue wavelength region.

Also, since the solid-state image sensing device according to an exemplary embodiment of the present invention achieves an ARS using the same material as the substrate, it is possible to easily realize an ARS even when a material having optical characteristics that considerably fluctuate according to wavelength is used for a substrate.

While the present invention has been particularly shown and described with reference to exemplary embodiments thereof, it will be understood by those of ordinary skill in the art that various changes in form and details may be made therein without departing from the spirit and scope of the present invention, as defined by the following claims.

What is claimed is:

1. A solid state image sensing device comprising:
   a photodiode region; and
   a transistor region,
   wherein the photodiode region comprises:
   a semiconductor substrate;
   a first anti-reflection layer formed on the semiconductor substrate;
   a second anti-reflection layer formed on the first anti-reflection layer; and
   a top layer formed on the second anti-reflection layer,
   wherein each of the semiconductor substrate and the second anti-reflection layer is formed of a first material, and each of the first anti-reflection layer and the top layer is formed of a second material different from the first material,
   wherein the first material comprises polysilicon,
   wherein the semiconductor substrate receives an incident light from the exterior through the first anti-reflection layer, the second anti-reflection layer and the top layer, and
   wherein the refractive indexes and dispersions of the photodiode region are matched to provide uniform anti-reflection.

2. The solid state image sensing device of claim 1, wherein the second material comprises silicon oxide.

3. A solid state image sensing device comprising:
   a photodiode region; and
   a transistor region, wherein the photodiode region comprises:

a semiconductor substrate formed of a first material;

a top layer formed in an upper portion of the photodiode region and formed of a second material different from the first material; and a plurality of anti-reflection layers formed between the semiconductor substrate and the top layer, wherein each of the plurality of anti-reflection layers is formed of one of the first material and the second material, and the anti-reflection layers formed of the first material and the anti-reflection layers formed of the second material are alternately formed, wherein the first material comprises polysilicon, wherein the semiconductor substrate receives an incident light from the exterior through the first anti-reflection layer, the second anti-reflection layer and the top layer, and wherein the refractive indexes and dispersions of the photodiode region are matched to provide uniform anti-reflection.

4. The solid state image sensing device of claim 3, wherein the second material comprises silicon oxide.

5. A solid state image sensing device comprising:

a photodiode region; and a transistor region, wherein the photodiode region comprises:

a semiconductor substrate formed of a first material;

a top layer formed in an upper portion of the photodiode region and formed of a second material different from the first material; and a plurality of anti-reflection layers formed between the semiconductor substrate and the top layer, wherein the plurality of anti-reflection layers includes a second anti-reflection structure layer formed of the second material and a first anti-reflection structure layer, wherein the first anti-reflection structure layer is formed of the first material and is formed on the second anti-reflection layer, wherein the first material comprises polysilicon, wherein the semiconductor substrate receives an incident light from the exterior through the first anti-reflection layer, the second anti-reflection layer and the top layer, and wherein the refractive indexes and dispersions of the photodiode region are matched to provide uniform anti-reflection.

6. The solid state image sensing device of claim 5, wherein the second material comprises silicon oxide.

* * * * *